United States Patent
Lee

(10) Patent No.: US 7,538,600 B2
(45) Date of Patent: May 26, 2009

(54) VOLTAGE GENERATOR AND SEMICONDUCTOR MEMORY APPARATUS WITH THE SAME

(75) Inventor: Ihl-Ho Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 258 days.

(21) Appl. No.: 11/594,833

(22) Filed: Nov. 9, 2006

(65) Prior Publication Data

US 2007/0146053 A1 Jun. 28, 2007

(30) Foreign Application Priority Data

Dec. 28, 2005 (KR) ...................... 10-2005-0131392

(51) Int. Cl.
*G05F 1/10* (2006.01)

(52) U.S. Cl. ..................................... 327/536

(58) Field of Classification Search ................. 327/536, 327/537

See application file for complete search history.

(56) References Cited

U.S. PATENT DOCUMENTS

| | | | |
|---|---|---|---|
| 5,818,290 A * | 10/1998 | Tsukada ..................... | 327/537 |
| 5,886,933 A | 3/1999 | Seo et al. | |
| 6,018,264 A * | 1/2000 | Jin ............................ | 327/536 |
| 6,177,828 B1 | 1/2001 | Kang et al. | |
| 6,194,931 B1 * | 2/2001 | Hwang ....................... | 327/157 |
| 6,320,457 B1 | 11/2001 | Yang | |
| 6,628,555 B2 * | 9/2003 | Kondo et al. ............. | 365/189.09 |
| 6,653,888 B2 | 11/2003 | Lee | |
| 6,741,118 B2 * | 5/2004 | Uchikoba et al. ........... | 327/541 |
| 6,784,723 B2 | 8/2004 | Lee et al. | |
| 6,853,567 B2 | 2/2005 | Kwon | |
| 6,876,247 B2 | 4/2005 | Jang et al. | |
| 6,930,535 B2 | 8/2005 | Kim | |
| 7,292,483 B2 * | 11/2007 | Sohn et al. ............. | 365/189.09 |
| 7,312,649 B2 * | 12/2007 | Origasa et al. .............. | 327/536 |
| 2005/0141319 A1 | 6/2005 | Jang | |

(Continued)

FOREIGN PATENT DOCUMENTS

JP 3130998 6/1991

(Continued)

OTHER PUBLICATIONS

Taiwan Office Action dated Feb. 6, 2009 for Application No. 95142099.

*Primary Examiner*—Lincoln Donovan
*Assistant Examiner*—William Hernandez
(74) *Attorney, Agent, or Firm*—Venable LLP; Jeffri A. Kaminski

(57) ABSTRACT

A voltage generator includes: a pumping voltage detecting section configured to detect a level of a pumping voltage in accordance with a reference voltage, that activates a pumping enable signal when the detected level of the pumping voltage is higher than a first voltage, while activating a power source voltage drive signal when the detected level of the pumping voltage is lower than the first voltage. A pumping section generates the pumping voltage through a pumping operation when the pumping enable signal is active. A power source voltage driving section generates the pumping voltage at a level of an external power source voltage when the power source voltage drive signal is active.

21 Claims, 5 Drawing Sheets

U.S. PATENT DOCUMENTS

2007/0222500 A1 * 9/2007 Youn et al. .................. 327/536

FOREIGN PATENT DOCUMENTS

| | | |
|---|---|---|
| JP | 06096593 A | 4/1994 |
| JP | 2001127254 A | 5/2001 |
| JP | 2003030985 A | 1/2003 |
| JP | 2003091991 A | 3/2003 |
| KR | 1019970067351 | 10/1997 |
| KR | 1020010059032 A | 7/2001 |
| TW | 1239010 | 9/2005 |

* cited by examiner

VOLTAGE GENERATOR AND SEMICONDUCTOR MEMORY APPARATUS WITH THE SAME

CROSS-REFERENCE TO RELATED APPLICATIONS

This U.S. non-provisional patent application claims priority under 35 U.S.C. § 119 of Korean Patent Application No. 2005-131392 filed on Dec. 28, 2005, the entire contents of which are hereby incorporated by reference.

BACKGROUND

Embodiments of the present invention disclosed herein relate to techniques of voltage generation in semiconductor memory apparatuses and more particularly, to a voltage generator capable of reducing current consumption by minimizing the number of pumping cycles under the condition of low power.

Most memory chips accessing memory cells usually conduct refresh operations by selecting word lines or rows by means of row addresses. Especially, in a DRAM as a kind of volatile memory, as memory cells must be operable during long refresh times, cell transistors have high threshold voltages. Thus, an elevated voltage (VPP) is required for turning such memory cells on, and for reading/writing data from/to the memory cells.

Since the level of the elevated voltage (VPP) is higher than or equal to an external power source voltage (VDD), a semiconductor memory apparatus usually makes the elevated voltage (VPP) by conducting an internal pumping operation. A circuit for generating the elevated voltage (VPP) by a pumping operation is referred to as an elevated generator (or pumping voltage generator).

With regard-to generation of the elevated voltage (VPP), FIG. 1 shows a circuit diagram of a conventional voltage generator.

The conventional voltage generator is formed by a reference voltage generator 10, a pumping voltage detecting section 20, and a pumping section 30.

The reference voltage generator 10 outputs a reference voltage Vrefp to the pumping voltage detecting section 20. The pumping voltage detecting section 20 outputs a pumping enable signal PPEN to the pumping section 30 after detecting the level of a pumping voltage VPP in accordance with the reference voltage Vrefp. The pumping section 30 generates the pumping voltage VPP by conducting a pumping operation in accordance with the pumping enable signal PPEN. The pumping voltage VPP is applied to a selection line of a memory cell 40, i.e., a word line, to read/write data. A capacitor C1 is coupled between a terminal of the pumping voltage VPP and a ground voltage terminal.

FIG. 2 is a circuit diagram of the pumping voltage detecting section 20 shown in FIG. 1.

The pumping voltage detector 20 includes a pumping voltage dividing section 21 and a pumping enable signal generating section 22. The pumping voltage dividing section 21 is configured to divide the pumping voltage VPP by means of resistors R1~R6 serially coupled between the pumping voltage terminal and the ground voltage terminal, generating a divisional voltage DIV_VPP.

The pumping enable signal generating section 22 includes a comparing unit formed by PMOS transistors P1 and P2 and NMOS transistors N1~N6, and a driving unit formed by PMOS transistors P3~P5 and NMOS transistors N7~N9.

The comparing unit outputs a result arising from comparing the divisional voltage DIV_VPP with the reference voltage Vrefp. The driving unit outputs the pumping enable signal PPEN by driving the result output from the comparing unit.

The divisional voltage DIV_VPP is based on of the reference voltage Vrefp. Namely, the pumping voltage detecting section 20 outputs the pumping enable signal PPEN at low level when the divisional voltage DIV_VPP is higher than the reference voltage Vrefp. But, when the divisional voltage DIV_VPP is lower than the reference voltage Vrefp, the pumping enable signal PPEN goes to high level to make the pumping section 30 conduct the pumping operation.

As the pumping voltage VPP is involved in accessing memory cells along a row, it causes large current consumption when the memory cell 40 is operating in a row access mode or a refresh mode.

In detail, the amount of current IPP consumed by a current source CC1 during the row access mode is proportional to the level the pumping voltage VPP decreases. Thus, as the pumping voltage VPP drops under a target value, the pumping enable signal PPEN is activated to make the pumping section 30 operable. The pumping section 30 boosts an external power source voltage VDD to double or triple its level.

The following Table 1 simply shows a comparison of current efficiencies and pump structures by voltage products.

TABLE 1

| Product | Pump structure | Current efficiency (IPP/IDD) |
|---------|----------------|------------------------------|
| 1.8 V   | Trippler       | 40~50%                       |
| 2.5 V   | Doubler        | 25~35%                       |
| 3.3 V   | Doubler        | 25~35%                       |

As can be seen from Table 1, when the target level of the pumping voltage VPP is 3.3~3.5V, the pump structure of a product using a 2.5V external is that of a doubler. And, a product using a 1.8V external power source voltage uses a trippler pump structure. Here, if a doubler pump structure is used in a product with a 1.8V external power source voltage, an ideal voltage 3.6V is logically generated, but this is very difficult in practice.

Further, an internal elevated voltage should be constant even with variation of the external power source voltage VDD (permitted to be 10% higher or lower). Therefore, although the external power source voltage VDD approximates the pumping voltage, a doubler pump structure is required.

For instance, even when the external power source voltage VDD is 3.3V and the pumping voltage VPP is 3.3V, the external power source voltage VDD may be supplied externally by 3.0V level and hence there is a need for a doubler pump structure. Also, a pump structure boosting VDD up to 1.5 times, instead of the doubler pump structure, may be considered, but there is difficulty in implementing the circuit architecture. Even with the doubler pump structure, the current of IDD flowing therein unavoidably makes the IPP current output less than 50% efficient. In an ideal doubler pump structure, the external power source voltage VDD must have a current of 2 mA in order to generate the pumping voltage VPP at 1 mA.

On the other hand, trippler pump structures are also employed in semiconductor memory products using lower voltages. The pump structure for 2.5V or 3.3V is constructed in a single chip for the purpose of enhancing the mediocrity of the product. In this organization, a trippler pump structure operating over a wide range of 1.8~3.3V is designed so it may be changed into a doubler pump structure when there is a need to use 2.5V or 3.3V.

FIG. 3 shows the results of a simulation that represents the efficiency of a pump using an external power source voltage over a wide range. The graph of FIG. 3 depicts the pumping efficiency when boosting the external power source voltage VDD up towards the target level of the pumping voltage VPP of 3.3V. It can be seen from FIG. 3 that the pumping efficiency is just over 30% when a pumping operation is carried out by a doubler structure and there is a need for using an IDD current over three times the desired IPP current. Thus, it causes an IDD current loss of about 70% using a pumping operation with a doubler structure at 3.3V.

In particular, as DRAM memories are employed in mobile storage apparatuses requiring low power, such current losses would create malfunctions of operating voltages.

SUMMARY

Embodiments of the present invention provide a voltage generator for reducing the rate of current consumption by minimizing the number of pumping operations at low power by way of using an external power source voltage as a pumping voltage and conducting the pumping operation only when a target level is higher than the external power source voltage.

Embodiments of the present invention also provide a voltage generator for greatly shortening the recovery time of a pumping voltage and reducing the number of pumping operations, by using an external power source voltage and the pumping voltage simultaneously to drive a pumping voltage output when the level of the pumping voltage is lower than a predetermined voltage level.

Embodiments of the present invention also provide a voltage generator for greatly improving current efficiency by performing a small number of pumping operations, suitable for low power memory such as a mobile storage apparatus.

Embodiments of the present invention provide a method of generating a voltage in a semiconductor memory apparatus, which consumes less power by shortening the recovery time of a pumping voltage and reducing the number of pumping operations.

An embodiment of the present invention provides a voltage generator comprising: a pumping voltage detecting section configured to detect a level of a pumping voltage in accordance with a reference voltage, that activates a pumping enable signal when the detected level of the pumping voltage is higher than a first voltage, while activating a power source voltage drive signal when the detected level of the pumping voltage is lower than the first voltage; a pumping section configured to generate the pumping voltage through a pumping operation when the pumping enable signal is active; and a power source voltage driving section configured to generate the pumping voltage at a level of an external power source voltage when the power source voltage drive signal is active.

The voltage generator may comprise a reference voltage generator that outputs a reference voltage to the pumping voltage detecting section.

The first voltage may be a voltage level when the pumping voltage is lower than a predetermined target level by 0~10%.

The pumping voltage detecting section may comprise: a pumping voltage dividing section configured to divide the pumping voltage, that generates a first divisional voltage and a second divisional voltage less than the first divisional voltage; a power source voltage drive controlling section configured to compare the first divisional voltage with the reference voltage and drive an external power source voltage in accordance with the result of the comparison, thereby and generate the power source voltage drive signal; a pumping enable signal generating section configured to compare the second divisional voltage with the reference voltage and drive the external power source voltage in accordance with the result of the comparison, thereby and generate a first pumping enable signal; and a pumping voltage drive controlling section configured to generate a second pumping enable signal from a logical operation of the power source voltage drive signal and the first pumping enable signal.

The pumping voltage detecting section may be configured to activate selectively activate the power source voltage drive signal in an active period of the first pumping enable signal, and activate the second pumping enable signal in periods except the active period of the power source voltage drive signal in the active period of the first pumping enable signal.

The pumping voltage detecting section may comprise a plurality of resistors that are coupled between a terminal of the pumping voltage and a ground voltage terminal, and generate the first and second divisional voltages through separate nodes.

The power source voltage drive controlling section may comprise: a first comparing section configured to compare the first divisional voltage with the reference voltage during supply of a first bias voltage; and a first driving section configured to output the power source voltage drive signal by driving the external power source voltage in accordance with an output of the first comparing section.

The pumping enable signal generating section may comprise: a second comparing section configured to compare the second divisional voltage with the reference voltage during the supply of a second bias voltage; and a second driving section configured to output the first pumping enable signal by driving the external power source voltage in accordance with an output of the second comparing section.

Another embodiment of the present invention provides a voltage generator comprising: a pumping voltage detecting section configured to detect the level of a pumping voltage in accordance with a reference voltage, activate a pumping enable signal when the detected level of the pumping voltage is higher than a first voltage, while activating both the pumping enable signal and a power source voltage drive signal when the detected level of the pumping voltage is lower than the first voltage; a pumping section configured to generate the pumping voltage through a pumping operation when the pumping enable signal is active; and a power source voltage driving section configured to generate the pumping voltage at a level of an external power source voltage when the power source voltage drive signal is active.

Still another embodiment of the present invention provides a semiconductor memory apparatus including a voltage generator comprising: a pumping voltage detecting section configured to detect the level of a pumping voltage in accordance with a reference voltage, activate a pumping enable signal when the detected level of the pumping voltage is higher than a first voltage, while activating a power source voltage drive signal when the detected level of the pumping voltage is lower than the first voltage; a pumping section configured to generate the pumping voltage through a pumping operation when the pumping enable signal is active; a power source voltage driving section configured to generate the pumping voltage at a level of an external power source voltage when the power source voltage drive signal is active; and a memory cell configured to read and write data in accordance with an output voltage of the pumping section or the power source voltage driving section during an active mode.

Yet another embodiment of the present invention provides a method for generating a voltage comprising: a first step configured to detect a drop of a pumping voltage by a pumping voltage detecting section; a second step configured to determine a pumping enable period in response to the detection of the voltage drop in the first step; a third step configured to boost the pumping voltage first that has dropped in the pumping enable period determined in the second step; a fourth step configured to supply an external power source voltage in the pumping enable period determined in the second step and boost the pumping voltage that has been dropped; and a fifth step configured to boost the pumping voltage again that has dropped in the pumping enable period determined in the second step.

The first and second steps may be carried out by means of the pumping voltage detecting section. The third and fifth steps may be carried out by means of a pumping section. The fourth step may be carried out by means of a power source voltage driving section. The third and fourth steps may be carried out in sequence.

Still another embodiment of the present invention provides a method for generating a voltage comprising: a first step configured to detect a drop of a pumping voltage by a pumping voltage detecting section; a second step configured to generate an enable signal to make a pumping section conduct a pumping operation in response to the detection of voltage drop in the first step; a third step configured to generate a power source voltage control signal to supply an external power source voltage for boosting the dropped pumping voltage up to a predetermined set value when the dropped pumping voltage is lower than the predetermined set value; and a fourth step, if the pumping voltage reaches the target level after the third step, configured to boost the pumping voltage up to a target level by conducting the second step.

The first step may be carried out by means of the pumping voltage detecting section. The second and fourth steps may be carried out by means of the pumping section. The third step may be carried out by means of a power source voltage driving section. The pumping section and power source voltage supplying section may all be activated during the third step.

A further understanding of the nature and advantages of the present invention herein may be realized by reference to the remaining portions of the specification and the attached drawings.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified. In the figures.

DESCRIPTION OF EXEMPLARY EMBODIMENTS

Hereinafter, embodiments of the present invention are described in detail below with reference to the accompanying drawings.

Figure 1:
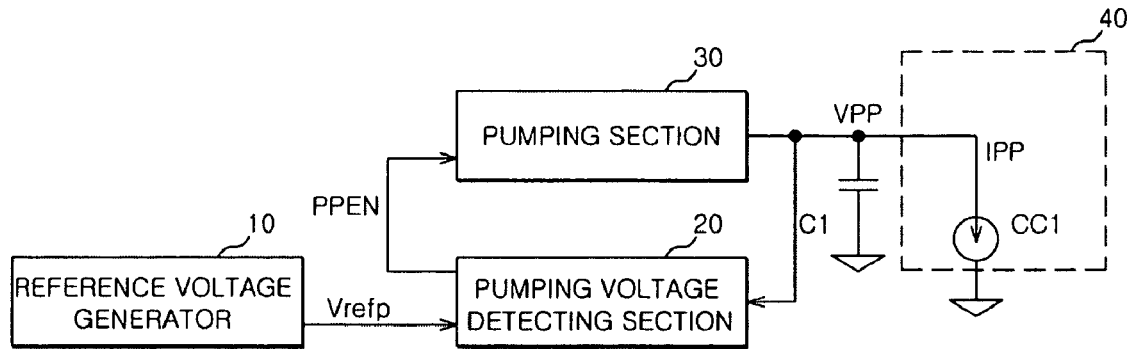
FIG. 1 is a schematic of a conventional voltage generator.
Figure 2:
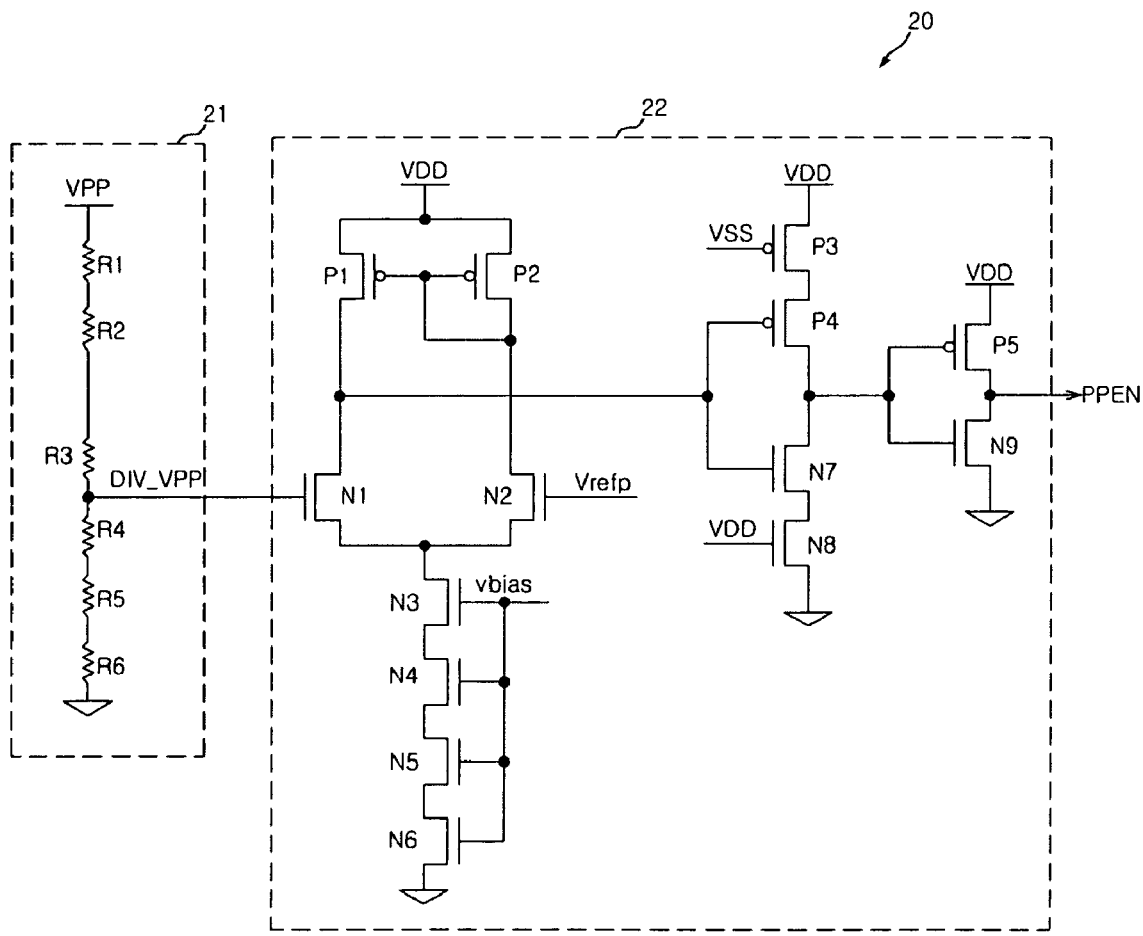
FIG. 2 is a circuit diagram of the pumping voltage detecting section shown in FIG. 1.
Figure 3:
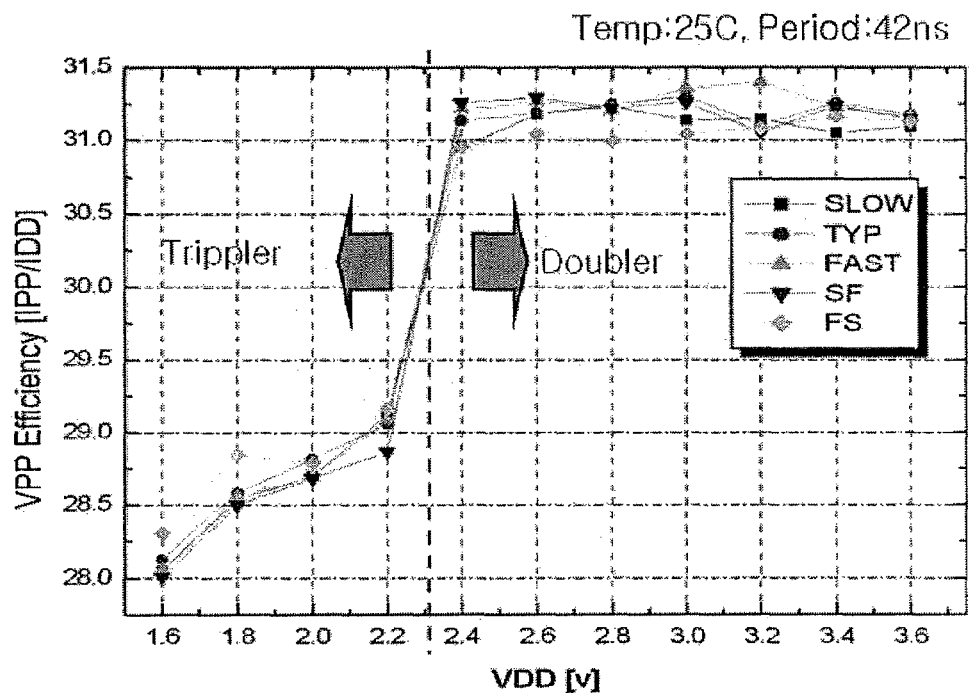
FIG. 3 is a graph showing the pumping efficiency of a conventional voltage generator.
Figure 4:
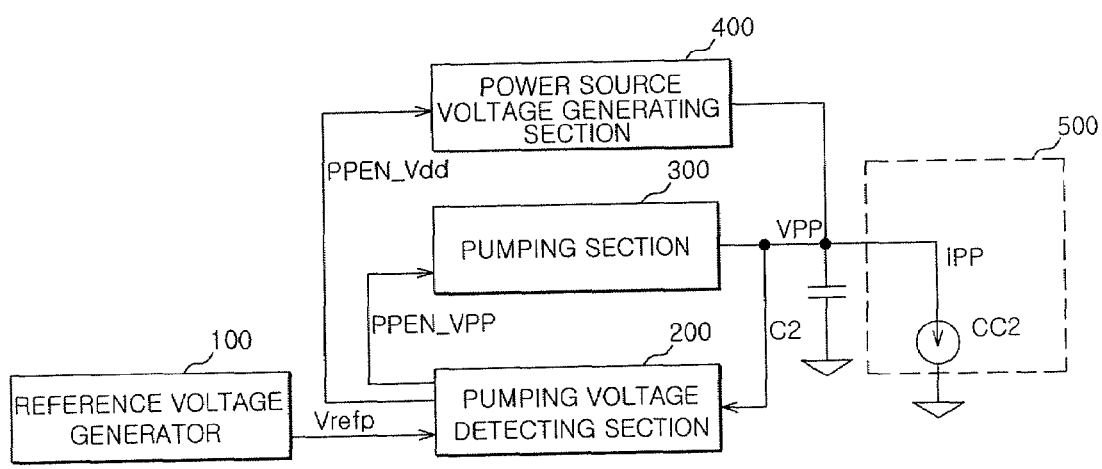
FIG. 4 is a schematic of a semiconductor memory apparatus including a voltage generator according to an embodiment of the present invention.

FIG. 4 is a schematic of a semiconductor memory apparatus including a voltage generator according to the present invention.

Referring to FIG. 4, the voltage generator comprises a reference voltage generator 100, a pumping voltage detecting section 200, a pumping section 300, and a power source voltage driving section 400. The reference voltage generator 100 outputs a reference voltage Vrefp. The pumping voltage detecting section 200 activates a pumping enable signal PPEN_VPP when the level of a pumping voltage VPP, which is detected according to the reference voltage Vrefp, is higher than a first voltage, and activates a power source voltage drive signal PPEN_Vdd when the detected pumping voltage VPP is lower than the first voltage. The pumping section 300 conducts a pumping operation to output the pumping voltage VPP when the pumping enable signal PPEN_VPP is active. The power source voltage driving section 400 outputs the pumping voltage VPP at a level of an external power source voltage VDD when the power source voltage drive signal PPEN_Vdd is being active. The pumping voltage VPP is supplied to a memory cell 500.

The reference voltage generator 100 outputs the reference voltage Vrefp to the pumping voltage detecting section 200. The pumping voltage detecting section 200 detects the level of the pumping voltage VPP on the basis of the reference voltage Vrefp, outputs the pumping enable signal PPEN_VPP to the pumping section 300 and outputs the power source voltage drive signal PPEN_Vdd to the power source voltage driving section 400.

The pumping section 300 provides the memory cell 500 with the pumping voltage VPP, for reading/writing data, by conducting the pumping operation in response to the pumping enable signal PPEN_VPP.

The power source voltage driving 400 supplies the external power source voltage VDD to a VPP node in response to the power source voltage drive signal PPEN_Vdd, driving the VPP node to be charged to the VDD level. A capacitor C2 is coupled between the VPP node and a ground voltage terminal.

Figure 5:
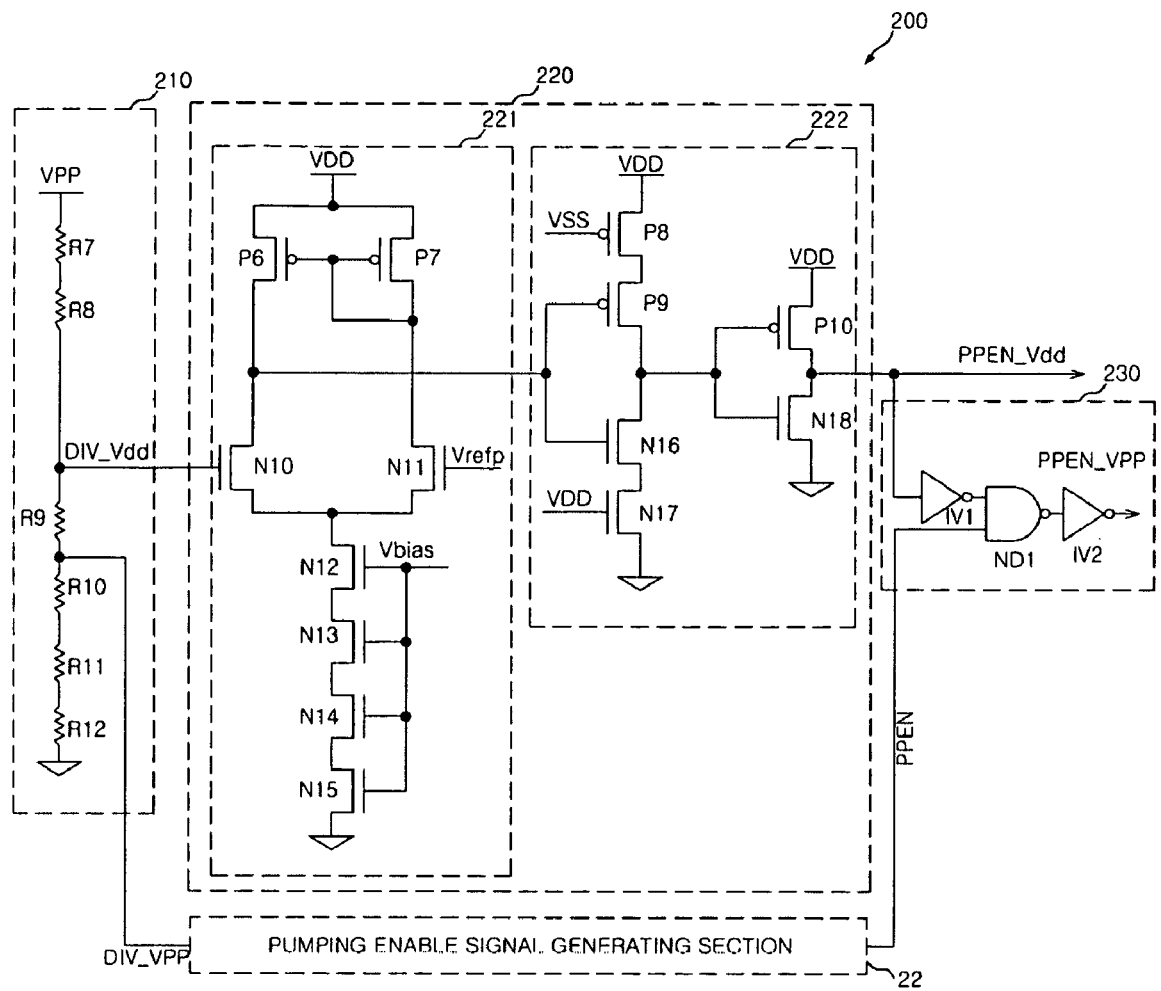
FIG. 5 is a detailed circuit diagram of the pumping voltage detecting section shown in FIG. 4.

FIG. 5 is a detailed circuit diagram of the pumping voltage detecting section 200 shown in FIG. 4.

Referring to FIG. 5, the pumping voltage detecting section 200 comprises a pumping voltage dividing section 210, a power source voltage drive controlling section 220, a pumping enable signal generating section 22, and a pumping voltage drive controlling section 230. The pumping voltage dividing section 210 divides the pumping voltage VPP, generating a first divisional voltage DIV_Vdd and a second divisional voltage DIV_VPP lower than the first divisional voltage DIV_Vdd. The power source voltage drive controlling section 220 compares the first divisional voltage DIV_Vdd with the reference voltage Vrefp and then outputs the power source voltage drive signal PPEN_Vdd to drive the external power source voltage VDD in accordance with the result of the comparison. The pumping enable signal generating section 22 compares the second divisional voltage DIV_VPP with the reference voltage Vrefp and then generates a first pumping enable signal PPEN in accordance with the result of the comparison. The pumping voltage drive controlling section 230 conducts a logical operation with the power source voltage drive signal PPEN_Vdd and the first pumping enable signal PPEN and then generates the second pumping enable signal PPEN_VPP.

The pumping voltage dividing section 210 comprises of resistors R7~R12 serially connected between a VPP terminal and the ground voltage terminal. The pumping voltage dividing section 210 provides the pumping enable signal generator 22 with the second divisional voltage DIV_VPP through dividing the pumping voltage VPP by means of the resistors R7~R12. The first divisional voltage DIV_Vdd is supplied to the power source voltage drive controlling section 220. Here, the first divisional voltage DIV_Vdd is higher than the second divisional voltage DIV_VPP (by 10% thereof).

The power source voltage drive controlling section 220 is composed of a comparing section 221 and a driving section 222.

The comparing section 221 is embodied to include PMOS transistors P6 and P7 and NMOS transistors N10~N15. The PMOS transistors, P6 and P7, are supplied with the external power source voltage VDD through their common source terminal. The comparing section 221 compares the reference voltage Vrefp with the first divisional voltage DIV_Vdd applied thereto through gate terminals of the NMOS transistors N10 and N11 each coupled to the PMOS transistors P6 and P7, and then supplies the driving section 222 with a signal corresponding to the result of the comparison. The NMOS transistors N12~N15 serially coupled from a node between the NMOS transistors N10 and N11 to the ground voltage terminal are coupled to a bias voltage Vbias in common through their gate terminals. The bias voltage Vbias regulates the operation of the comparing section 221.

The driving section 222 comprises PMOS transistors P8~P10 and NMOS transistors N16~N18. The PMOS transistors, P8 and P9, and the NMOS transistors, N16 and N17, are coupled between the VDD terminal and the ground voltage terminal in series. The PMOS transistor P8 is supplied with the ground voltage VSS through its gate terminal. The NMOS transistor N17 is supplied with the external power source voltage VDD through its gate terminal. Common gate terminals of the PMOS and NMOS transistors P9 and N16 are coupled to an output terminal of the comparing section 221.

The PMOS and NMOS transistors, P10 and N18, are coupled between the VDD terminal and the ground terminal in series, their gate terminals being coupled to a common drain terminal of the PMOS and NMOS transistors P9 and N16. The PMOS and NMOS transistors, P10 and N18, are structured in a CMOS inverter. The inverter formed by the PMOS and NMOS transistors, P10 and N18, outputs the power source voltage drive signal PPEN_Vdd through their common drain terminal.

The pumping enable signal generating section 22 receives the second divisional voltage DIV_VPP through the pumping voltage dividing section 210 and then supplies the first pumping enable signal PPEN to the pumping voltage drive controlling section 230. The detailed circuit structure of the pumping enable signal generating section 22 is the same as that of the power source voltage drive controlling section 220, so it will not be described herein. The pumping enable signal generating section 22 compares the second divisional voltage DIV_VPP with the reference voltage Vrefp and drives a signal corresponding to a result of the comparison, finally outputting the first pumping enable signal PPEN.

The pumping voltage drive controlling section 230 comprises inverters IV1 and IV2 and a NAND gate ND1. The inverter IV1 logically inverts the power source voltage drive signal PPEN_Vdd. The NAND gate ND1 conducts a NAND operation with an output of the inverter IV1 and the first pumping enable signal PPEN. The inverter IV2 logically inverts an output of the NAND gate ND1, outputting the second pumping enable signal PPEN_VPP.

Figure 6:
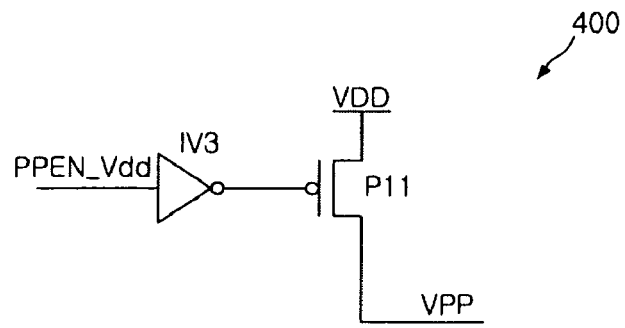
FIG. 6 is a detailed circuit diagram of the power source voltage driving section shown in FIG. 4.

FIG. 6 is a detailed circuit diagram of the power source voltage driving section 400 shown in FIG. 4.

The power source voltage driving section 400 comprises an inverter IV3 and a PMOS transistor P11. The inverter IV3 inverts the logical level of the power source voltage drive signal PPEN_Vdd. The PMOS transistor P11 is coupled between the VDD terminal and the VPP terminal, receiving an output signal of the inverter IV3 through its gate terminal.

The structural features shown FIGS. 5 and 6 are implemented by considering the functions of blocks shown in FIG. 4, which may be modified in various logical circuits. For example, the power source voltage driving section 400 of FIG. 6 is implemented such that the power source voltage drive signal PPEN_Vdd is input through the inverter IV3, it is even permissible to disuse the inverter IV3 by altering the logical pattern of the driving section 222 shown in FIG. 5. And, the number of the resistors R7~R12 included in the pumping voltage dividing section 210 of FIG. 5 may be properly established by considering the level of the pumping voltage VPP or the external power source voltage VDD. Moreover, it is also possible to properly set the number of NMOS transistors N12~N15 formed at the drive stage of the comparing section 221, e.g., in a single on if considering the logical requirement. Then, the structure of FIG. 5 shows an embodiment for the number of the NMOS transistors in the comparing section 221. Also, the pumping voltage drive controlling section 230 may be implemented in various patterns for logical operations, and other logical configurations may be modified.

Figure 7:
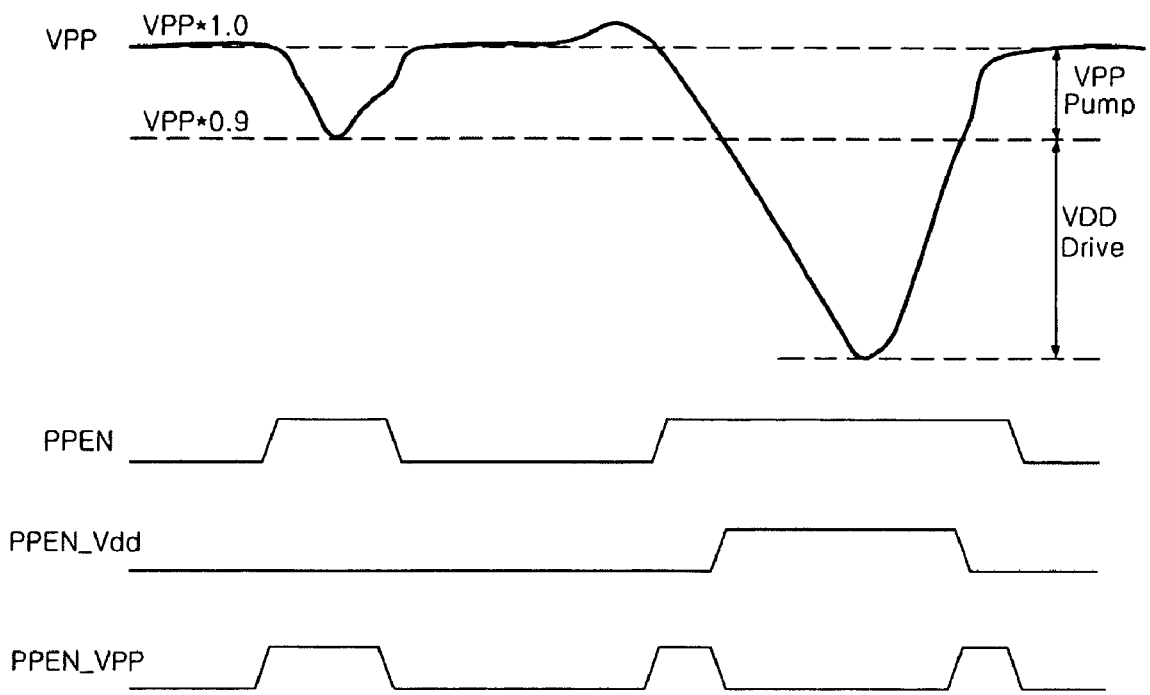
FIG. 7 is a timing diagram showing an operational feature of the voltage generator according to an embodiment of the present invention.

An operational feature of the voltage generator according to an embodiment of the present invention will be described with reference to the timing diagram of FIG. 7.

First, the pumping voltage dividing section 210 generates the first divisional voltage DIV_Vdd, which is higher than the second divisional voltage DIV_VPP, by dividing the pumping voltage VPP. The comparing section 221 compares the first divisional voltage DIV_Vdd with the reference voltage Vrefp, by which the first divisional voltage DIV_Vdd becomes identical to the reference voltage Vrefp when the pumping voltage VPP is lower than a target level (practically less than about 90% of the target level of the pumping voltage VPP). Accordingly, in response to the activation of the power source voltage drive signal PPEN_Vdd, the PMOS transistor P1 is turned on to generate the pumping voltage VPP at the same level as the external power source voltage VDD.

To the contrary, if the pumping voltage VPP is higher than the target level (practically over about 90% of the target level of the pumping voltage VPP), the power source voltage drive signal PPEN_Vdd is inactivated and the second pumping enable signal. PPEN_VPP is activated. According to the activation of the second pumping enable signal PPEN_VPP, the pumping section 300 begins the pumping operation to output the pumping voltage VPP.

When a chip of the semiconductor memory apparatus is operating in a refresh mode, the memory cell 500 consumes a large amount of the IPP current to cause a voltage drop in the pumping voltage VPP.

In an embodiment of the present invention, an active period for pumping is established in accordance with a rate of voltage drop in the pumping voltage VPP. Namely, the pumping enable signal generating section 22 outputs the first pumping enable signal PPEN from sensing that the pumping voltage VPP is lower than the target level.

The power source voltage drive controlling section 220, assuming that a detection signal is the first divisional voltage DIV_Vdd when the pumping voltage VPP decreases by about 10% from the target level, activates the power source voltage drive signal PPEN_VDD in a period where the pumping voltage VPP drops by 10% of the target level (i.e., VPP is less than 90% of the target level).

And, the second pumping enable signal PPEN_VPP is activated in all periods except a period where the power source voltage drive signal PPEN_Vdd is activated while the first pumping enable signal PPEN is active. Consequently, when the pumping voltage VPP drops to less than 90% of the target level, the power source voltage driving section 400 is activated. When the pumping voltage VPP is charged up to 100% of the target level, the pumping section 300 is activated.

Figure 8:
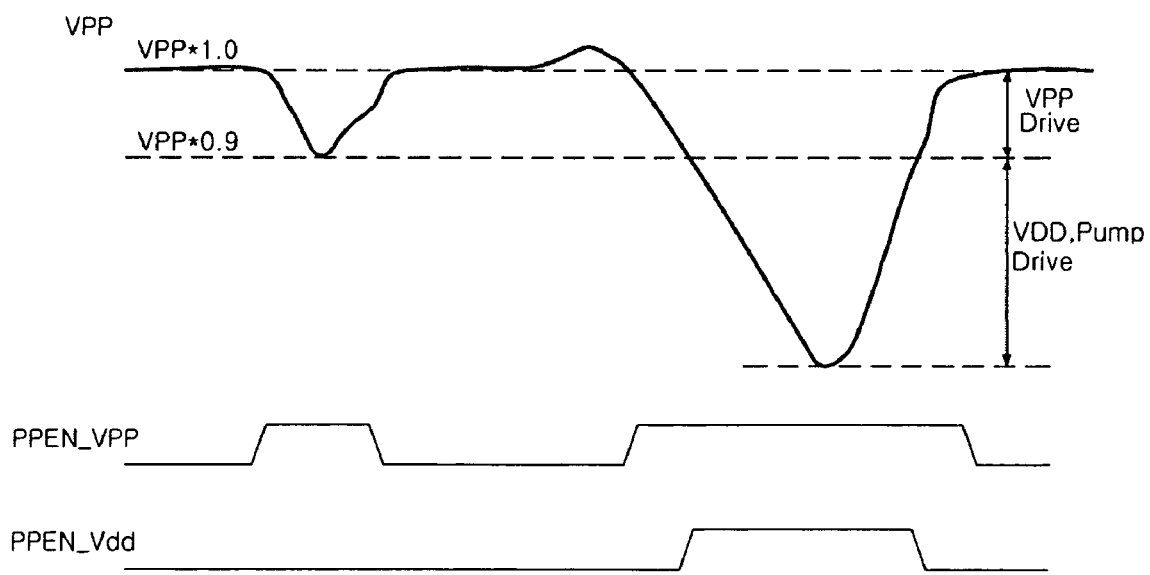
FIG. 8 is a timing diagram showing another embodiment of the voltage generator according to an embodiment of the present invention.

In the mean time, while the aforementioned embodiment is described with the feature that the second pumping enable signal PPEN_VPP is activated in all periods except a period where the power source voltage drive signal PPEN_Vdd is activated by selective activation of the power source voltage driving section 400, the present invention is not restricted hereto. For example, as illustrated in the timing diagram of FIG. 8, it is permissible to activate the pumping section 300 and the power source voltage driving section 400 at the same time when the pumping voltage VPP becomes less than 90% of the target level.

In this case, if the pumping voltage VPP decreases by about 10% from the target level, the second pumping enable signal PPEN_VPP is controlled to become active. And, when the pumping voltage VPP decreases to less than 90% of the target level, the power source voltage drive signal PPEN_Vdd is activated along with the second pumping enable signal PPEN_VPP. Accordingly, it is able to obtain a faster response characteristic, providing an effect of saving power for the pumping operation and the power source voltage driving operation.

Figure 9:
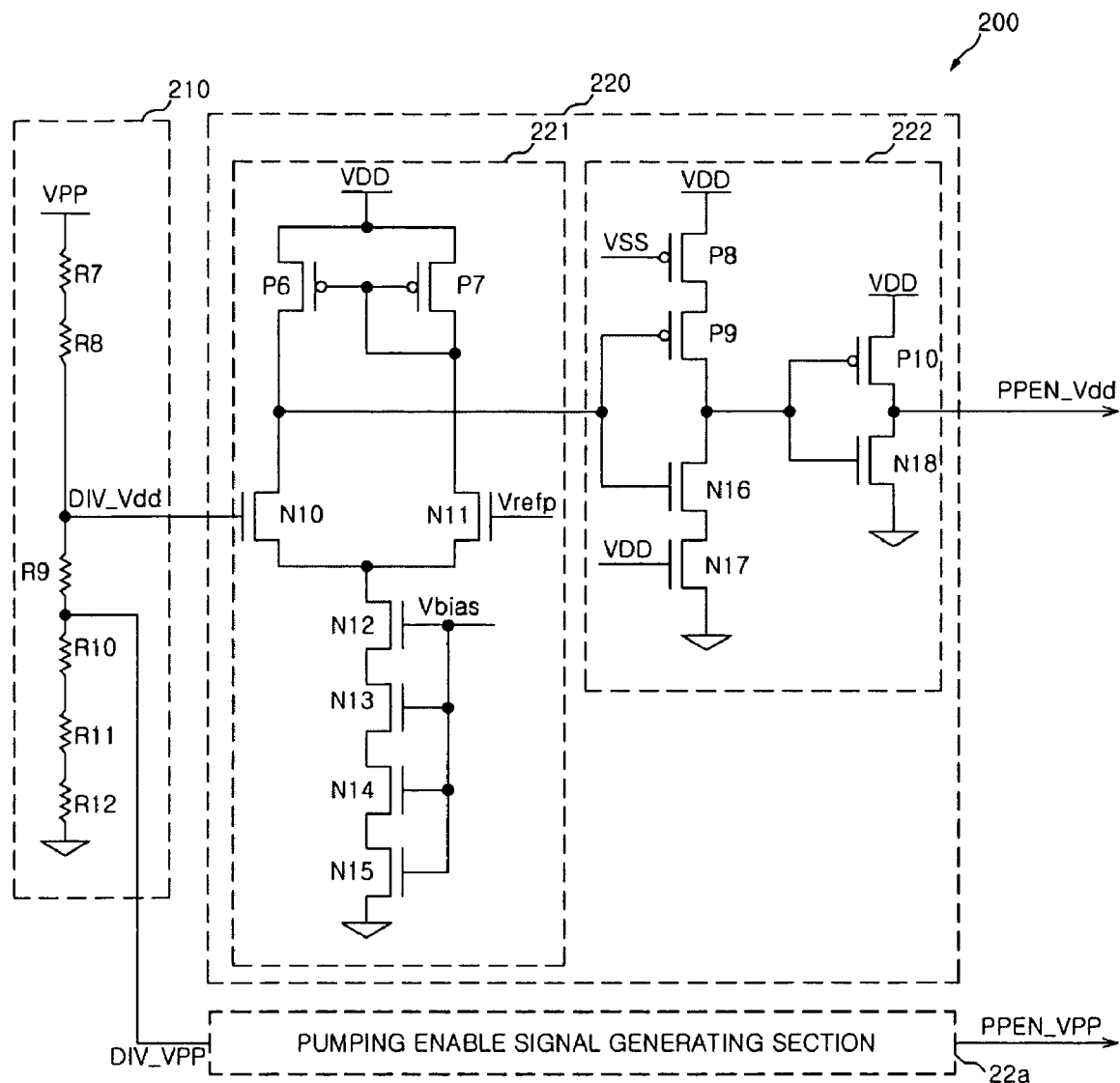
FIG. 9 is a circuit diagram illustrating another embodiment of the pumping voltage detecting section shown in FIG. 4.

FIG. 9 is a circuit diagram illustrating another embodiment of the pumping voltage detecting section 200 shown in FIG. 4. While the pumping voltage detecting section 200 of FIG. 5 is configured such that the pumping voltage drive controller 230 responds to both the power source voltage drive signal PPEN_Vdd of the power source voltage drive controlling section 220 and the first pumping enable signal PPEN of the pumping enable signal generating section 22, the feature of FIG. 9 uses a pumping enable signal generating section 22a for generating the pumping enable signal PPEN_VPP. The pumping enable signal generating section 22a functions as the pumping voltage drive controlling section 230 of FIG. 5, as well as directly generating the pumping enable signal PPEN_VPP, so that it is possible to reduce a circuit area of the pumping voltage detecting section 200.

As described above, embodiments of the present invention provide a voltage generator using an external power source voltage as a pumping voltage and conducting a pumping operation when a target level is higher than the external power source voltage. The voltage generator uses the IDD current for a pumping voltage lower than the external power source voltage, but uses a doubler effect with IDD*2 when there is a need to generate a pumping voltage higher than the external power source voltage. Thus, it minimizes the number of pumping operations during an active mode in the condition of low power, thereby reducing current consumption.

On the other hand, embodiments of the present invention enable all of a external power source voltage and a pumping voltage to be used when a detected level of the pumping voltage is lower than a predetermined voltage level, offering a voltage generator capable of shortening a recovery time of the pumping voltage while reducing the number of pumping operations. Moreover, it is effective in improving current efficiency by using a smaller number of pumping operations, suitable for a low power memory apparatus such as a mobile storage apparatus.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A voltage generator comprising:
   a pumping voltage detecting section configured to detect a level of a pumping voltage in accordance with a reference voltage, activate a pumping enable signal when the detected level of the pumping voltage is higher than a first voltage, while activating a power source voltage drive signal when the detected level of the pumping voltage is lower than the first voltage;
   a pumping section configured to generate the pumping voltage through a pumping operation when the pumping enable signal is active; and
   a power source voltage driving section configured to generate the pumping voltage at a level of an external power source voltage when the power source voltage drive signal is active,
   wherein the pumping voltage detecting section comprises:
   a pumping voltage dividing section configured to divide the pumping voltage, generate a first divisional voltage and a second divisional voltage lower than the first divisional voltage;
   a power source voltage drive controlling section configured to compare the first divisional voltage with the reference voltage and drive a external power source voltage in accordance with a result of the comparison, and generate the power source voltage drive signal;
   a pumping enable signal generating section configured to compare the second divisional voltage with the reference voltage and drive the external power source voltage in accordance with a result of the comparison, and generate a first pumping enable signal; and
   a pumping voltage drive controlling section configured to generate a second pumping enable signal from a logical operation of the power source voltage drive signal and the first pumping enable signal.

2. The voltage generator as set forth in claim 1, which further comprises:
   a reference voltage generator configured to output the reference voltage to the pumping voltage detecting section.

3. The voltage generator as set forth in claim 1, wherein the first voltage is configured to be a voltage level when the pumping voltage is lower than a predetermined target level by 0~10%.

4. The voltage generator as set forth in claim 1, wherein the pumping voltage detecting section is configured to activate selectively the power source voltage drive signal in an active period of the first pumping enable signal, and activate the second pumping enable signal during periods except an active period of the power source voltage drive signal in the active period of the first pumping enable signal.

5. The voltage generator as set forth in claim 1, wherein the pumping voltage dividing section comprises a plurality of resistors coupled between a pumping voltage terminal and a ground voltage terminal, and is configured to generate the first and second divisional voltages through separate nodes.

6. The voltage generator as set forth in claim 1, wherein the power source voltage drive controlling section comprises:
a first comparing section having an output and configured to compare the first divisional voltage with the reference voltage during the supply of a first bias voltage; and
a first driving section configured to output the power source voltage drive signal by driving the external power source voltage in accordance with the output of the first comparing section.

7. The voltage generator as set forth in claim 1, wherein the pumping enable signal generating section comprises:
a second comparing section having an output and configured to compare the second divisional voltage with the reference voltage during supply of a second bias voltage; and
a second driving section configured to output the first pumping enable signal by driving the external power source voltage in accordance with the output of the second comparing section.

8. The voltage generator as set forth in claim 1, wherein the pumping voltage drive controlling section comprises:
a first inverter having an output and configured to invert the power source voltage drive signal;
a first logical element having an output and configured to conduct a logical operation of the output of the first inverter and the first pumping enable signal; and
a second inverter configured to generate the second pumping enable signal by logically inverting the output of the first logical element.

9. The voltage generator as set forth in claim 8, wherein the first logical element comprises a first NAND gate.

10. The voltage generator as set forth in claim 1, wherein the power source voltage driving section is configured to short a pumping voltage terminal with a terminal of the external power source voltage during activation of the power source voltage drive signal.

11. The voltage generator as set forth in claim 10, wherein the power source voltage driving section comprises:
a third inverter having an output and configured to invert the power source voltage drive signal; and
a second logical element coupled between the pumping voltage terminal and the external power source voltage terminal and having a gate terminal configured to receive the output of the third inverter.

12. The voltage generator as set forth in claim 11, wherein the second logical element comprise a PMOS transistor.

13. A voltage generator comprising:
a pumping voltage detecting section configured to detect a level of a pumping voltage in accordance with a reference voltage, activate a pumping enable signal when the detected level of the pumping voltage is higher than a first voltage, while activating both the pumping enable signal and a power source voltage drive signal when the detected level of the pumping voltage is lower than the first voltage;
a pumping section configured to generate the pumping voltage through a pumping operation when the pumping enable signal is active; and
a power source voltage driving section configured to generate the pumping voltage at a level of an external power source voltage when the power source voltage drive signal is active,
wherein the pumping voltage detecting section comprises:
a pumping voltage drive controlling section configured to generate a second pumping enable signal from a logical operation of the power source voltage drive signal and a first pumping enable signal.

14. The voltage generator as set forth in claim 13, which further comprises:
a reference voltage generator configured to output the reference voltage to the pumping voltage detecting section.

15. The voltage generator as set forth in claim 13, wherein the first voltage is configured to be a voltage level when the pumping voltage is lower than a predetermined target level by 0~10%.

16. The voltage generator as set forth in claim 13, wherein the pumping voltage detecting section further comprises:
a pumping voltage dividing section configured to divide the pumping voltage, generate a first divisional voltage and a second divisional voltage lower than the first divisional voltage;
a power source voltage drive controlling section configured to compare the first divisional voltage with the reference voltage and drive an external power source voltage in accordance with a result of the comparison, and generate the power source voltage drive signal; and
a pumping enable signal generating section configured to compare the second divisional voltage with the reference voltage and drive the external power source voltage in accordance with a result of the comparison, and generate the pumping enable signal.

17. The voltage generator as set forth in claim 16, wherein the power source voltage drive signal is selectively activated in an active period of the pumping enable signal.

18. A semiconductor memory apparatus comprising:
a pumping voltage detecting section configured to detect a level of a pumping voltage in accordance with a reference voltage, activate a pumping enable signal when the detected level of the pumping voltage is higher than a first voltage, while activating a power source voltage drive signal when the detected level of the pumping voltage is lower than the first voltage;
a pumping section configured to generate the pumping voltage through a pumping operation when the pumping enable signal is active;
a power source voltage driving section configured to generate the pumping voltage at a level of an external power source voltage when the power source voltage drive signal is active; and
a memory cell configured to read and write data in accordance with the pumping voltage output of the pumping section or the power source voltage driving section during an active mode,
wherein the pumping voltage detecting section comprises:
a pumping voltage dividing section configured to divide the pumping voltage, generate a first divisional voltage and a second divisional voltage lower than the first divisional voltage;
a power source voltage drive controlling section configured to compare the first divisional voltage with the reference voltage and drive a external power source voltage in accordance with a result of the comparison, and generate the power source voltage drive signal;

a pumping enable signal generating section configured to compare the second divisional voltage with the reference voltage and drive the external power source voltage in accordance with a result of the comparison, and generate a first pumping enable signal; and a pumping voltage drive controlling section configured to generate a second pumping enable signal from a logical operation of the power source voltage drive signal and the first pumping enable signal.

19. The semiconductor memory apparatus as set forth in claim 18, which further comprises:

a reference voltage generator configured to output the reference voltage to the pumping voltage detecting section.

20. The semiconductor memory apparatus as set forth in claim 18, wherein the first voltage is configured to be a voltage level when the pumping voltage is lower than a predetermined target level by 0~10%.

21. The semiconductor memory apparatus as set forth in claim 18, wherein the power source voltage drive signal is selectively activated in an active period of the pumping enable signal.

* * * * *